United States Patent
Bu et al.

(10) Patent No.: US 8,114,784 B2
(45) Date of Patent: Feb. 14, 2012

(54) LAMINATED STRESS OVERLAYER USING IN-SITU MULTIPLE PLASMA TREATMENTS FOR TRANSISTOR IMPROVEMENT

(75) Inventors: Haowen Bu, Plano, TX (US); Che-Jen Hu, Plano, TX (US); Rajesh Khamankar, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/904,593

(22) Filed: Oct. 14, 2010

(65) Prior Publication Data

US 2011/0027953 A1    Feb. 3, 2011

Related U.S. Application Data

(62) Division of application No. 11/959,111, filed on Dec. 18, 2007, now abandoned.

(51) Int. Cl.
*H01L 21/31* (2006.01)
(52) U.S. Cl. .. 438/778; 438/199; 438/791; 257/E21.632
(58) Field of Classification Search ............. 438/199, 438/791, 792, 778; 257/E21.632
See application file for complete search history.

(56) References Cited

U.S. PATENT DOCUMENTS

| 6,939,814 | B2 | 9/2005 | Chan et al. | |
| 7,397,073 | B2 | 7/2008 | Engel et al. | |
| 7,517,816 | B2 * | 4/2009 | Frohberg et al. | 438/783 |
| 7,585,704 | B2 * | 9/2009 | Belyansky et al. | 438/131 |
| 2009/0068854 | A1 * | 3/2009 | Chen et al. | 438/792 |

OTHER PUBLICATIONS

Wolf, et al, Silicon Processing for the VLSI ERA vol. 1: Process Technology, Lattice Press, 1986, pp. 192-194.

* cited by examiner

*Primary Examiner* — Kenneth Parker
*Assistant Examiner* — Jose R Diaz
(74) *Attorney, Agent, or Firm* — Jacqueline J. Garner; Wade J. Brady, III; Frederick J. Telecky, Jr.

(57) ABSTRACT

Integrated circuits (ICs) commonly contain pre-metal dielectric (PMD) liners with compressive stress to increase electron and hole mobilities in MOS transistors. The increase is limited by the thickness of the PMD liner. The instant invention is a multi-layered PMD liner in an integrated circuit which has a higher stress than single layer PMD liners. Each layer in the inventive PMD liner is exposed to a nitrogen-containing plasma, and which has a compressive stress higher than 1300 MPa. The PMD liner of the instant invention is composed of 3 to 10 layers. The hydrogen content of the first layer may be increased to improve transistor properties such as flicker noise and Negative Bias Temperature Instability (NBTI). An IC containing the inventive PMD liner and a method for forming same are also claimed.

6 Claims, 5 Drawing Sheets

LAMINATED STRESS OVERLAYER USING IN-SITU MULTIPLE PLASMA TREATMENTS FOR TRANSISTOR IMPROVEMENT

FIELD OF THE INVENTION

This invention relates to the field of integrated circuits. More particularly, this invention relates to methods to improve MOS transistors.

BACKGROUND OF THE INVENTION

Designers and fabricators of integrated circuits (ICs) strive to increase speeds of operation of circuits in ICs. A common method of increasing operating speed is to increase current supplied by MOS transistors, known as drive current. One technique for increasing drive current is to increase electron mobilities in inversion layers of n-channel MOS transistors and increase hole mobilities in inversion layers of p-channel MOS transistors by increasing stress on the silicon lattice in the inversion layers. This is frequently accomplished by forming a dielectric layer on the MOS transistors, typically containing silicon nitride, known as the pre-metal dielectric (PMD) liner, with compressive stress. The increase in drive currents achievable by this method is limited by the thickness of the PMD liner, which is constrained by minimum gate spacing and other considerations.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention is a multi-layered pre-metal dielectric (PMD) liner in an integrated circuit, in which each layer is exposed to a nitrogen-containing plasma, and which has a compressive stress higher than 1300 MPa. The PMD liner of the instant invention is composed of 3 to 10 layers. The hydrogen content of the first layer may be increased to improve transistor properties such as flicker noise and Negative Bias Temperature Instability (NBTI). An IC containing the inventive PMD liner and a method for forming same are also claimed.

DETAILED DESCRIPTION

The present invention is described with reference to the attached figures. The figures are not drawn to scale and they are provided merely to illustrate the invention. Several aspects of the invention are described below with reference to example applications for illustration. It should be understood that specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
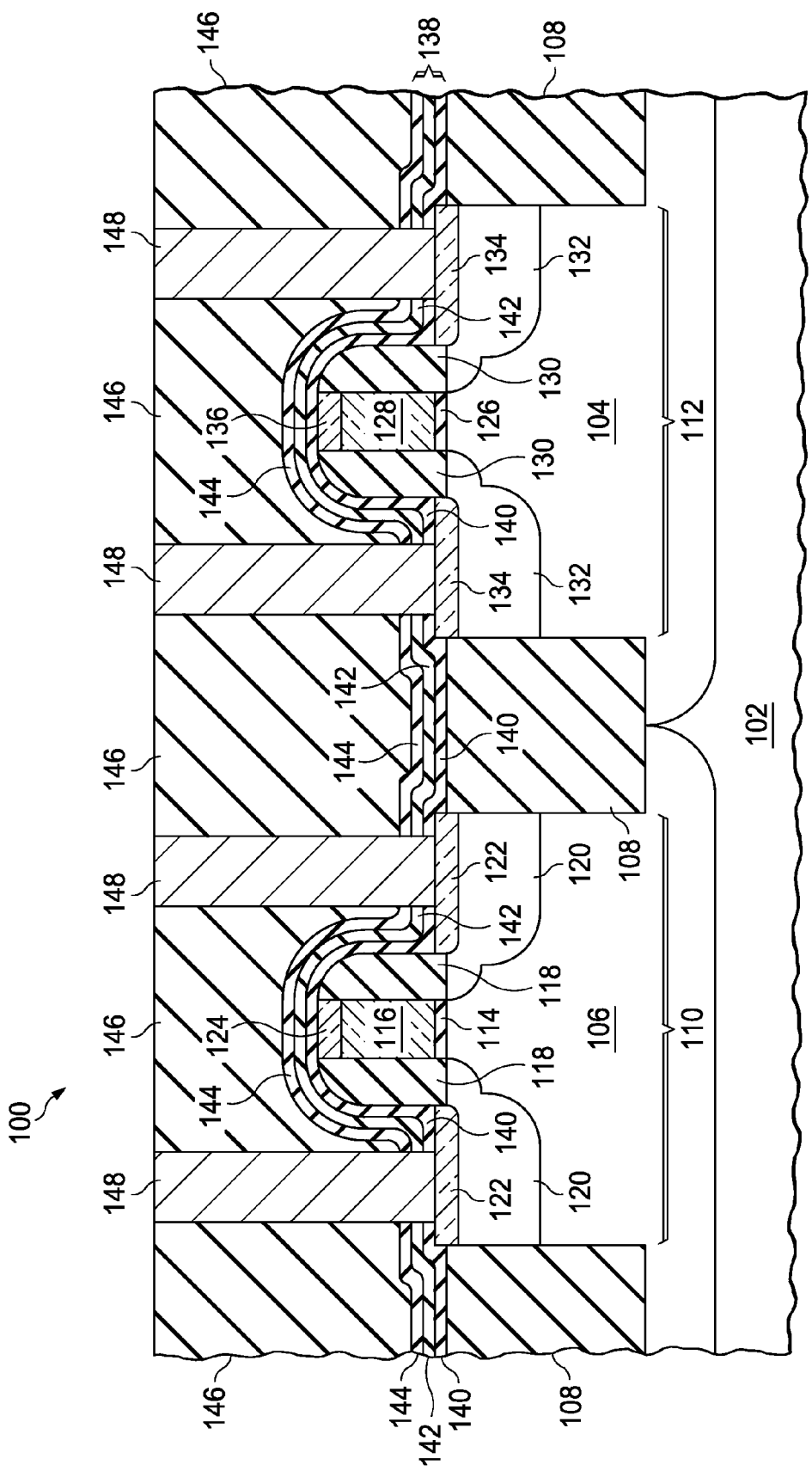
FIG. 1 is a cross-section of an IC with MOS transistors and a PMD liner formed according to an embodiment of the instant invention.

FIG. 1 is a cross-section of an IC with MOS transistors and a PMD liner formed according to an embodiment of the instant invention. IC (100) includes a substrate (102) typically p-type silicon, an n-well (104) formed in the substrate, typically by ion implantation of an n-type dopant such as phosphorus, a p-well (106) formed in the substrate adjacent to the n-well (104), typically by ion implantation of a p-type dopant such as boron, and regions of field oxide (108), typically silicon dioxide, formed in the substrate, typically by Shallow Trench Isolation (STI). An n-channel MOS transistor (110) is formed in the p-well (106); a p-channel MOS transistor (112) is formed in the n-well (104). The n-channel MOS transistor is formed by forming a gate dielectric (114), typically silicon dioxide with optional nitrogen, then forming a gate structure (116), typically polycrystalline silicon, followed by gate sidewall spacers (118), typically made of layers of silicon nitride and silicon dioxide, abutting the gate structure, followed by formation of n-type source and drain regions (120) by ion implantation of n-type dopants such as phosphorus and arsenic. Metal silicide (122), commonly nickel silicide or cobalt silicide, is formed on top surfaces of the n-type source and drain regions. Optional metal silicide (124), commonly nickel silicide or cobalt silicide, is formed on a top surface of the gate structure (116). Similarly, the p-channel MOS transistor is formed by forming a gate dielectric (126), typically silicon dioxide with optional nitrogen, then forming a gate structure (128), typically polycrystalline silicon, followed by gate sidewall spacers (130), typically made of layers of silicon nitride and silicon dioxide, abutting the gate structure, followed by formation of p-type source and drain regions (132) by ion implantation of p-type dopants such as boron. Metal silicide (134), commonly nickel silicide or cobalt silicide, is formed on top surfaces of the p-type source and drain regions. Optional metal silicide (136), commonly nickel silicide or cobalt silicide, is formed on a top surface of the gate structure (128).

To increase the mobility of electrons and holes in the n-channel MOS and p-channel MOS transistors, respectively, a PMD liner layer stack according to an embodiment of the instant invention (138) is formed on a top surface of the n-channel MOS transistor, the p-channel MOS transistor, and the field oxide (108). In an embodiment of the instant invention, the PMD liner layer stack is made up of 3 to 10 individual layers containing silicon nitride; each layer is deposited in a deposition chamber and then exposed to a nitrogen-containing plasma in the deposition chamber prior to deposition of a next layer. The nitrogen-containing plasma may be formed by a breakdown of N2 or NH3 gas. When N2 is used, the hydrogen content tends to be reduced after the plasma exposure. If the hydrogen concentration is to be maintained or increased during the nitrogen-containing plasma exposure, then NH3 should be used to form the plasma after deposition of each layer. Nitrogen from the nitrogen-containing plasma increases the compressive stress of the just-deposited layer. Successive layers are deposited and exposed to nitrogen-containing plasmas in a similar manner. This process generates a PMD liner layer stack with higher stress than a single layer PMD liner of the same total thickness; for example, a laminated PMD layer stack has been demonstrated with 200 to 300 MPa higher stress than a comparable single layer PMD liner. This is advantageous because the higher stress in the PMD liner layer stack of the instant invention increases the electron and hole mobilities more than would a single layer PMD liner of the same total thickness; for the example given above, n-channel MOS transistor rive currents were 3 to 5 percent higher. It is not necessary to remove the ICs from the deposition chamber between layer depositions; this is advantageous as it increase fabrication throughput compared to other laminated layer processes. In another embodiment, the chemical composition of each layer may be altered to enhance a performance parameter of an underlying MOS transistor. For example, a first layer in a PMD liner layer stack formed according to an embodiment of the instant invention may have a higher hydrogen content than typical PMD liner materials, typically 25 atomic percent or more, which would reduce low frequency fluctuations in current through the MOS transistor, known as flicker noise, and reduce p-channel MOS transistor threshold instability, known as Negative Bias Temperature Instability (NBTI), during operation of the IC. The capability to tailor chemical compositions of individual layers in the PMD liner layer stack embodied in the instant invention is advantageous because it allows enhancement of selected performance parameters while maintaining higher stress values compared to a single layer PMD liner of the same total thickness.

Still referring to FIG. 1, following formation of the PMD liner, a pre-metal dielectric (PMD) layer (146), typically silicon dioxide, is deposited on a top surface of the PMD liner. Contacts (148), typically tungsten, are formed in the PMD (146) to connect to the source and drain regions (120, 132) of the MOS transistors (110, 112).

Figure 2A:
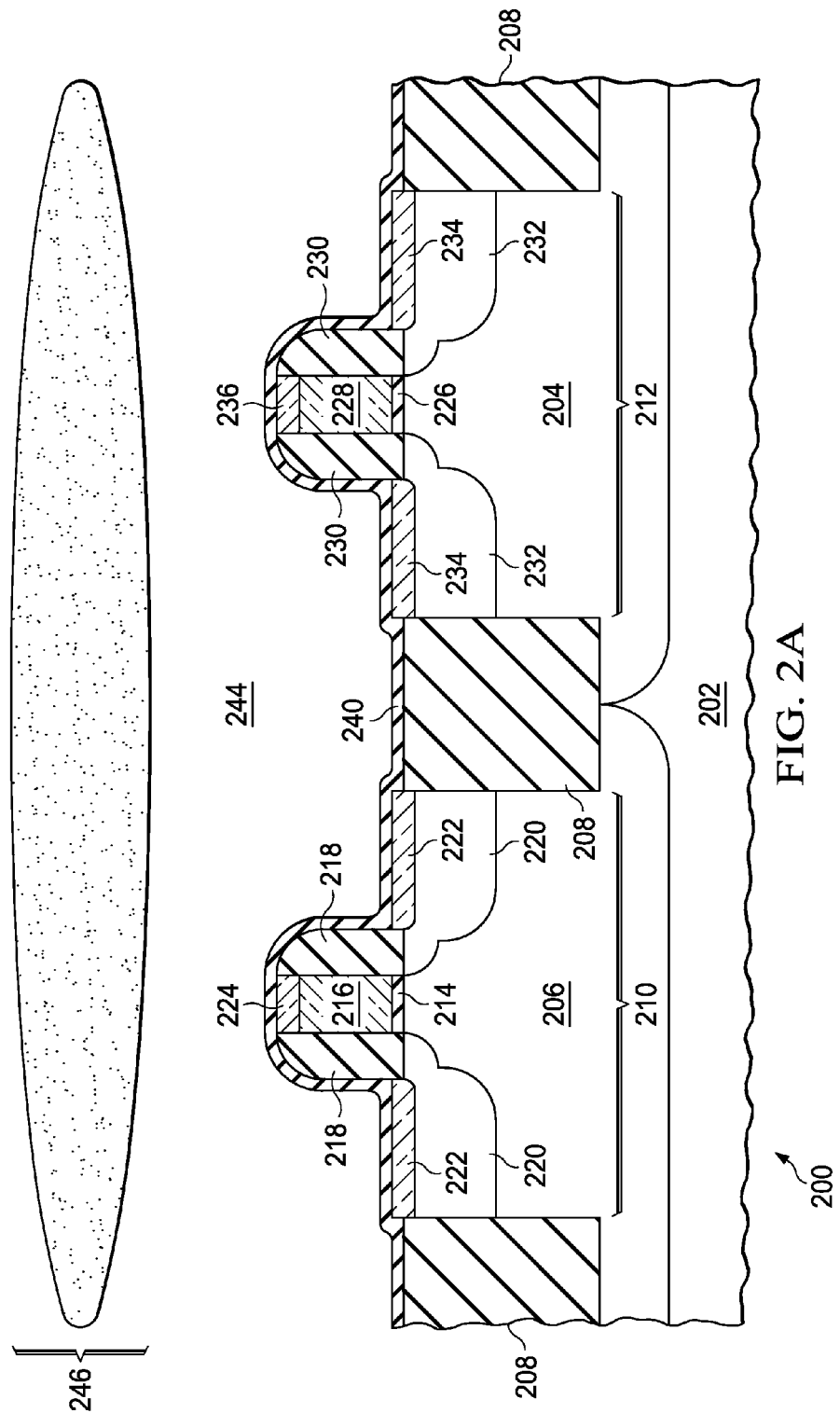
FIGS. 2A through 2D are cross-sections of an IC with MOS transistors during the process of formation of a PMD liner according to an embodiment of the instant invention.

FIGS. 2A through 2D are cross-sections of an IC with MOS transistors during the process of formation of a PMD liner according to an embodiment of the instant invention. FIG. 2A depicts a first layer of the PMD liner being deposited on the IC. IC (200) includes a substrate (202) typically p-type silicon, an n-well (204) formed in the substrate, typically by ion implantation of an n-type dopant such as phosphorus, a p-well (206) formed in the substrate adjacent to the n-well (204), typically by ion implantation of a p-type dopant such as boron, and regions of field oxide (208), typically silicon dioxide, formed in the substrate, typically by Shallow Trench Isolation (STI). An re-channel MOS transistor (210) is formed in the p-well (206); a p-channel MOS transistor (212) is formed in the n-well (204). The n-channel MOS transistor is formed by forming a gate dielectric (214), typically silicon dioxide with optional nitrogen, then forming a gate structure (216), typically polycrystalline silicon, followed by gate sidewall spacers (218), typically made of layers of silicon nitride and silicon dioxide, abutting the gate structure, followed by formation of n-type source and drain regions (220) by ion implantation of n-type dopants such as phosphorus and arsenic. Metal silicide (222), commonly nickel silicide or cobalt silicide, is formed on top surfaces of the n-type source and drain regions. Optional metal silicide (224), commonly nickel silicide or cobalt silicide, is formed on a top surface of the gate structure (216). Similarly, the p-channel MOS transistor is formed by forming a gate dielectric (226), typically silicon dioxide with optional nitrogen, then forming a gate structure (228), typically polycrystalline silicon, followed by gate sidewall spacers (230), typically made of layers of silicon nitride and silicon dioxide, abutting the gate structure, followed by formation of p-type source and drain regions (232) by ion implantation of p-type dopants such as boron. Metal silicide (234), commonly nickel silicide or cobalt silicide, is formed on top surfaces of the p-type source and drain regions. Optional metal silicide (236), commonly nickel silicide or cobalt silicide, is formed on a top surface of the gate structure (228). Deposition of the first PMD liner layer (240) of the PMD liner according to an embodiment of the instant invention proceeds by inserting the IC (200) into a deposition chamber (244). Deposition of the first PMD liner layer (240) containing silicon nitride may be performed on 200 mm diameter wafers by flowing SiH4 gas at 5 to 80 sccm, NH3 gas at 20 to 320 sccm, N2 gas at 2500 to 40,000 sccm, and possibly other gases, into the deposition chamber (244) to maintain a pressure of 1 to 100 torr. Deposition chamber temperature is maintained at 300 C to 400 C. A plasma (246) is formed in the SiH4 gas, NH3 gas, and N2 gas by supplying 10 to 150 watts RF power. These process conditions provide a deposition rate of 1 to 20 Angstroms per second on 200 mm diameter wafers. SiH4 gas, NH3 gas, and N2 gas flow rates and RF power level may be adjusted to maintain a desired deposition rate on another size wafer, for example a 300 mm diameter wafer.

Figure 2B:
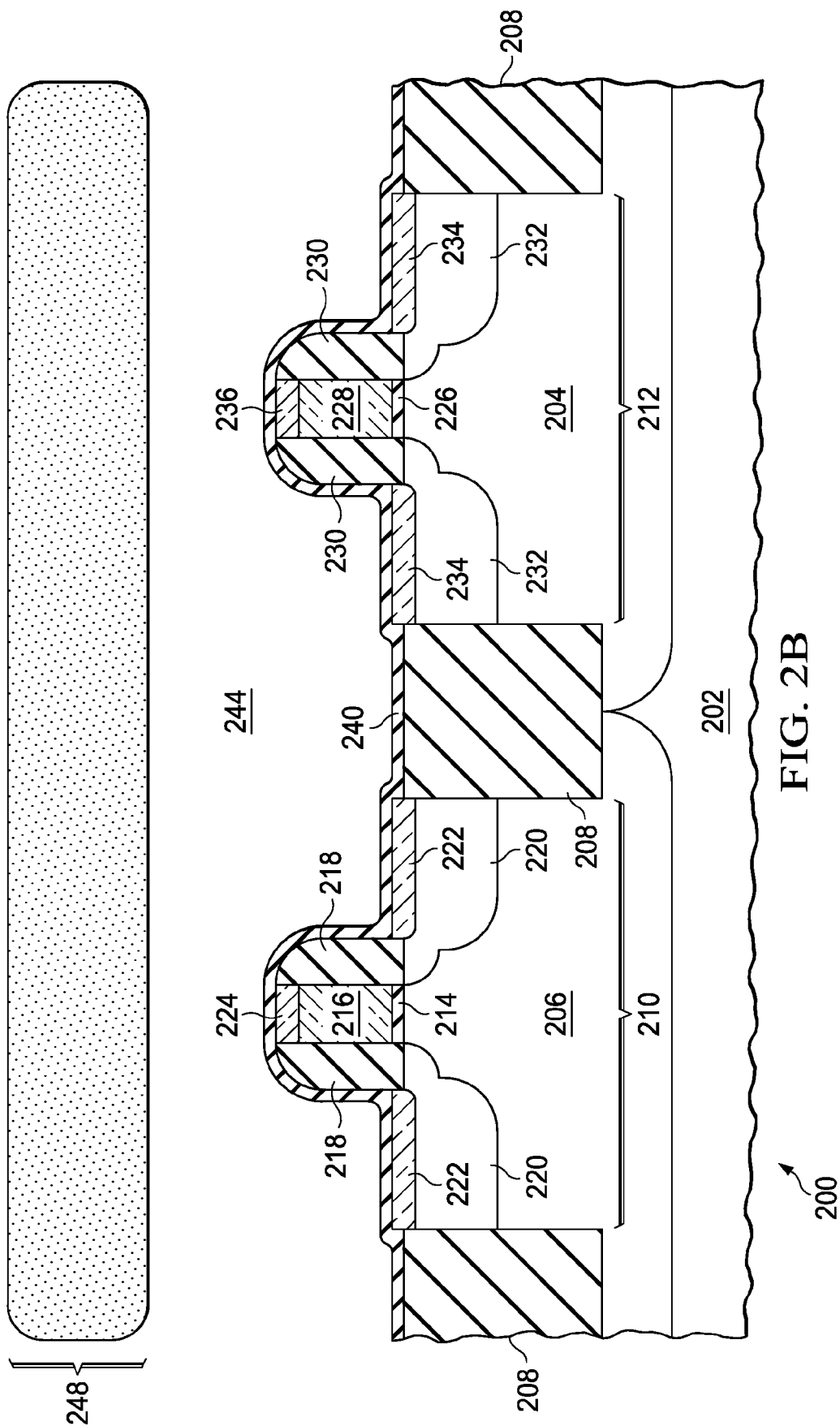

FIG. 2B depicts the IC during an exposure of the first PMD liner layer to a nitrogen-containing plasma. The IC (200) remains in the deposition chamber (244) after deposition of the first PMD liner layer (240). In the instant embodiment, the first PMD liner layer (240) is exposed to a plasma formed from NH3 gas. Exposure to a nitrogen-containing plasma based on NH3 may be performed on 200 mm diameter wafers by flowing NH3 gas at 500 to 10,000 sccm, and possibly other gases, into the deposition chamber (244) to maintain a pressure of 1 to 100 ton. Deposition chamber temperature is maintained at 300 C to 400 C. A plasma (248) is formed in the NH3 gas by supplying 10 to 200 watts RF power, for 10 to 150 seconds. These process conditions provide a hydrogen content in the silicon nitride containing film of 10 to 35 atomic percent on 200 mm diameter wafers. NH3 gas flow rate and RF power level may be adjusted to achieve a desired hydrogen content on another size wafer, for example a 300 mm diameter wafer.

Figure 2C:
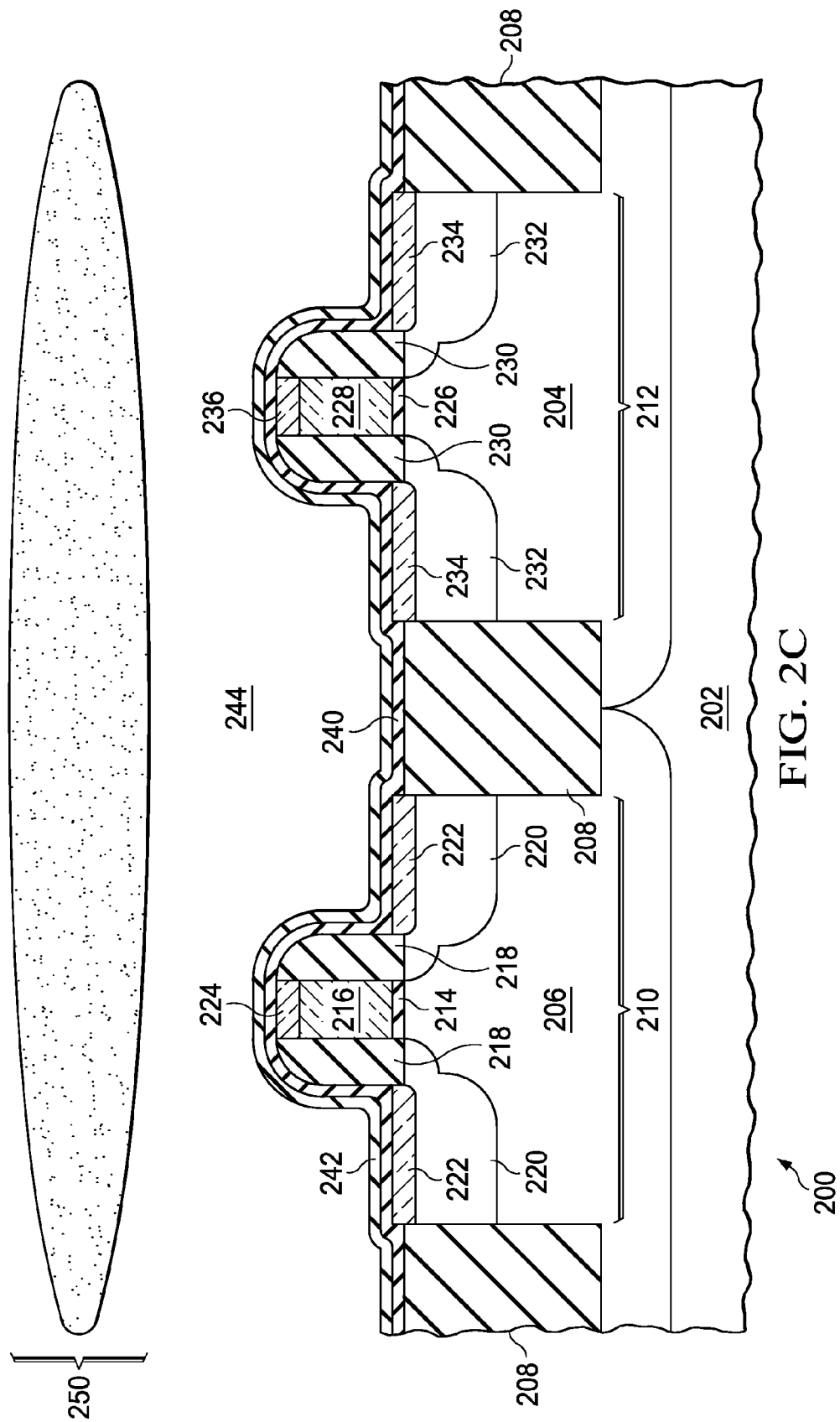

FIG. 2C depicts a second layer of the PMD liner being deposited on the IC. The IC (200) remains in the deposition chamber (244) after exposure of the first PMD liner layer to the nitrogen-containing plasma. Deposition of the second PMD liner layer (242) containing silicon nitride may be similarly performed on 200 mm diameter wafers by flowing SiH4 gas at 5 to 80 sccm, NH3 gas at 20 to 320 sccm, N2 gas at 2500 to 40,000 sccm, and possibly other gases, into the deposition chamber (244) to maintain a pressure of 1 to 100 ton. Deposition chamber temperature is maintained at 300 C to 400 C. A plasma (250) is formed in the SiH4 gas, NH3 gas, and N2 gas by supplying 10 to 150 watts RF power. These process conditions provide a deposition rate of 1 to 20 Angstroms per second on 200 mm diameter wafers. SiH4 gas, NH3 gas, and N2 gas flow rates and RF power level may be adjusted to maintain a desired deposition rate on another size wafer, for example a 300 mm diameter wafer.

Figure 2D:
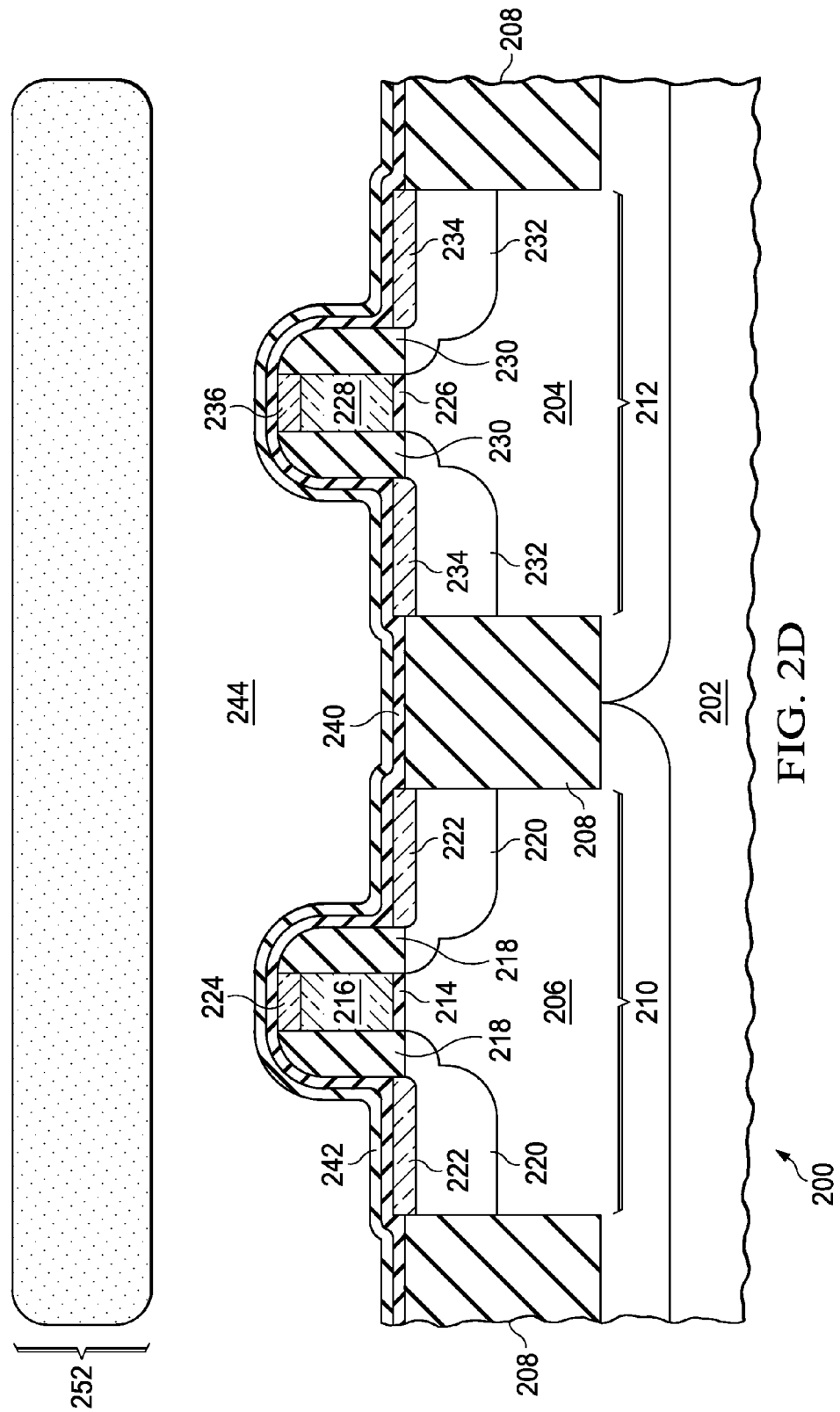

FIG. 2D depicts the IC during an exposure of the second PMD liner layer to a nitrogen-containing plasma. The IC (200) remains in the deposition chamber (244) after deposition of the second PMD liner layer (242). In the instant embodiment, the second PMD liner layer (242) is exposed to a plasma formed from N2 gas. Exposure to a nitrogen-containing plasma based on N2 may be performed on 200 mm diameter wafers by flowing N2 gas at 2500 to 40,000 sccm, and possibly other gases, into the deposition chamber (244) to maintain a pressure of 1 to 100 ton. Deposition chamber temperature is maintained at 300 C to 400 C. A plasma (252) is formed in the N2 gas by supplying 10 to 200 watts RF power, for 5 to 60 seconds. These process conditions provide a compressive stress of 500 to 2000 MPa on 200 mm diameter wafers. N2 gas flow rate and RF power level may be adjusted to achieve a desired stress level on another size wafer, for example a 300 mm diameter wafer.

Subsequent layers of the PMD liner are formed by repeating the processes discussed in reference to FIG. 2C and FIG. 2D above.

It is within the scope of the instant invention to expose the first layer of the PMD liner to a plasma formed from N2 instead of a plasma formed from NH3.

What is claimed is:

1. A method of forming an integrated circuit, comprising the steps of:
   providing a substrate;
   forming field oxide in said substrate;
   forming an n-well in said substrate;
   forming a p-well in said substrate;
   forming an n-channel MOS transistor in said p-well by a process comprising the steps of:
      forming a first gate dielectric on a top surface of said p-well;
      forming a first gate structure on a top surface of said first gate dielectric;
      forming n-type source and drain regions in said p-well adjacent to said first gate structure; and
      forming a first set of silicide regions on, and in contact with, top surfaces of said n-type source and drain regions;
   forming a p-channel MOS transistor in said n-well by a process comprising the steps of:
      forming a second gate dielectric on a top surface of said n-well;
      forming a second gate structure on a top surface of said second gate dielectric;
      forming p-type source and drain regions in said n-well adjacent to said second gate structure; and
      forming a second set of silicide regions on, and in contact with, top surfaces of said p-type source and drain regions;
   forming a pre-metal dielectric liner layer stack on said n-channel transistor and said p-channel transistor, by a process comprised of the steps of:
      providing a deposition chamber;
      inserting said substrate into said deposition chamber;
      depositing a first silicon nitride layer on said n-channel transistor and said p-channel transistor by a process comprising the steps of:
         flowing SiH4 gas at 5 to 80 sccm into the deposition chamber;
         flowing NH3 gas at 20 to 320 sccm into the deposition chamber;
         flowing N2 gas at 2500 to 40,000 sccm into the deposition chamber;
         maintaining a pressure of 1 to 100 ton in the deposition chamber;
         maintaining a temperature of 300 C to 400 C in the deposition chamber; and
         forming a plasma in the SiH4 gas, NH3 gas, and N2 gas by supplying 10 to 150 watts RF power;
      exposing said first silicon nitride layer to a nitrogen-containing plasma in said deposition chamber; and
      repeating said steps of depositing a silicon nitride layer and exposing the silicon nitride layer to a nitrogen-containing plasma for a plurality of iterations;
   forming a pre-metal dielectric layer on said pre-metal dielectric liner layer stack; and
   forming contacts in said pre-metal dielectric layer stack and in said pre-metal dielectric liner layer stack, on, and electrically connected to, said n-type source and drain regions and said p-type source and drain regions.

2. The method of claim 1, wherein said nitrogen-containing plasma is formed by a process comprising the steps of:
   flowing N2 gas at 2500 to 40,000 sccm into the deposition chamber;
   maintaining a pressure of 1 to 100 ton in the deposition chamber;
   maintaining a temperature of 300 C to 400 C in the deposition chamber; and
   forming a plasma in the N2 gas by supplying 10 to 200 watts RF power.

3. The method of claim 1, wherein a compressive stress in said pre-metal dielectric liner layer stack is higher than 1300 MPa.

4. The method of claim 1, wherein chemical compositions of all said layers in said pre-metal dielectric liner layer stack are not identical.

5. The method of claim 4, wherein a hydrogen content of a first layer in said pre-metal dielectric liner layer stack is at least 25 atomic percent.

6. The method of claim 5, wherein a first layer is exposed for 10 to 150 seconds to a nitrogen-containing plasma formed of NH3, which is formed by a process comprising the steps of:
   flowing NH3 gas at 500 to 10,000 sccm into said deposition chamber;
   maintaining a pressure of 1 to 100 ton in said deposition chamber;
   maintaining a temperature of 300 C to 400 C in said deposition chamber; and
   supplying 10 to 200 watts RF power.

* * * * *